(12) United States Patent
Chan et al.

(10) Patent No.: US 7,005,903 B2
(45) Date of Patent: Feb. 28, 2006

(54) OUTPUT BUFFER WITH ADJUSTMENT OF SIGNAL TRANSITIONS

(75) Inventors: Hong H. Chan, Portland, OR (US);
Jeffrey E. Smith, Aloha, OR (US);
Yongping Fan, Portland, OR (US);
Prantik K. Nag, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 10/726,297

(22) Filed: Dec. 2, 2003

(65) Prior Publication Data

US 2005/0116752 A1 Jun. 2, 2005

(51) Int. Cl.
*H03K 5/12* (2006.01)

(52) U.S. Cl. ..................... 327/170; 327/108

(58) Field of Classification Search ........ 327/108–109, 327/112, 170, 362; 326/82–87, 89–91
See application file for complete search history.

(56) References Cited

U.S. PATENT DOCUMENTS

| | | | |
|---|---|---|---|
| 4,975,598 A | 12/1990 | Bokar | ................. 326/32 |
| 5,898,321 A * | 4/1999 | Ilkbahar et al. | ................ 326/87 |
| 6,069,511 A | 5/2000 | Mohan | ................. 327/171 |
| 6,366,867 B1 | 4/2002 | Sine et al. | ................. 702/107 |
| 6,421,297 B1 * | 7/2002 | Huber | ................. 365/230.06 |
| 6,452,428 B1 | 9/2002 | Mooney et al. | ................. 327/108 |
| 6,538,464 B1 * | 3/2003 | Muljono et al. | ................. 326/27 |
| 6,542,004 B1 * | 4/2003 | Dunne | ................. 326/87 |
| 6,545,522 B1 | 4/2003 | Mughal et al. | ................. 327/334 |
| 6,571,376 B1 | 5/2003 | Levin et al. | ................. 716/5 |
| 6,696,860 B1 * | 2/2004 | Lim et al. | ................. 326/83 |
| 6,751,782 B1 * | 6/2004 | Levin et al. | ................. 716/1 |
| 2002/0190762 A1 | 12/2002 | Mooney et al. | ................. 327/108 |

* cited by examiner

*Primary Examiner*—My-Trang Nu Ton
(74) *Attorney, Agent, or Firm*—Schwabe, Williamson & Wyatt, P.C.

(57) ABSTRACT

An output buffer generates an output signal having a plurality of low-to-high (LH) and high-to-low (HL) signal transitions, with each of the signal transitions having a clock-to-output delay. A pre-driver having a first and a second stage generates a reshaped waveform to trigger the LH and HL signal transitions of the output signal, with the first stage generating an initial waveform and the second stage modifying the initial waveform to generate the reshaped waveform based at least in part on a feedback reflective of a difference in the clock-to-output delays of the LH and HL signal transitions.

36 Claims, 8 Drawing Sheets

OUTPUT BUFFER WITH ADJUSTMENT OF SIGNAL TRANSITIONS

BACKGROUND OF THE INVENTION

1. Field of the Invention

The present invention relates but not limited to electronic devices, and in particular, to output buffers for driving signals on digital buses.

2. Description of Related Art

High speed bus output drivers or buffers are used to drive digital signals over a digital bus. The bus output buffer is an interface circuit for placing an integrated circuit's (IC's) internal digital signal onto the bus. Prior art output buffers typically have a pre-driver and a driver, with the pre-driver's output waveform controlling a slew rate of the driver. The slew rate is the rate of change of voltage (voltage change/time) that an output buffer can generate when the driver is changing its output signal from low-to-high (LH signal transition) or high-to-low (HL signal transition). An optimal slew rate is statically selected for the bus, and all the output buffers connected to the bus are selected to have a substantially similar slew rate to support high speed signal transfer on the bus.

Some of logic components of the output buffers, such as the driver, have an asymmetric response to rising and falling transitions of the waveforms of digital signals. As an illustration of this asymmetric response, there is shown in FIG. 1 two pre-driver output waveforms (PREDRVOUT) which are used to turn on and off a NMOS driver in an assisted gunning transceiver logic (AGTL+) output buffer. The first waveform 10 is identified by voltage breakpoints A, C, D, E and the second waveform 12 is identified by voltage breakpoints A', C', D', E'. The maximum voltages at breakpoints A and E of waveform 10 and at breakpoints at A' and E' of waveform 12 illustrate how the supply voltage for the output buffer may vary. Switching by the pre-driver waveform to trigger the LH and HL transitions of the driver's output occurs approximately at a threshold voltage $V_{TN}$ (switch level) of a NMOS transistor of the driver. Hence, a LH switching delay period $t_{SWLH}$ is defined as the delay time period during which the pre-driver waveform's voltage decreases to reach the switching level voltage (transitions from source voltage to the threshold voltage $V_{TN}$), after which the pre-driver waveform triggers the LH transition of the driver's output. A HL switching delay period $t_{SWHL}$ is defined as the time delay period during which the pre-driver waveform's voltage increases to reach the switching level voltage (transitions from ground to the threshold voltage $V_{TN}$), after which the pre-driver waveform triggers the HL transition of the driver's output.

The term "$T_{CO}$" or "clock-to-output delay" is defined as the delay between a data clock and a valid output signal from the driver. The time difference in the signal switching delay periods $t_{SWLH}$ and $t_{SWHL}$ means that there are different $T_{CO}$ delays for the LH and HL transitions of the output signal of the driver. The time difference between the signal switching delay periods $t_{SWLH}$ and $t_{SWHL}$ is defined to create "$T_{CO}$ LH/HL skew" in the output of the driver. Hence, digital pulse signals propagating through these asymmetric logic components of the output buffer cause the output signals of the driver to be either shortened or lengthened due to $T_{CO}$ LH/HL skew.

In FIG. 1 there is a time difference between the signal switching delay periods $t_{SWLH}$ and $t_{SWHL}$ of the driver with both pre-driver waveforms 10 and 12; hence, both create $T_{CO}$ LH/HL skew. However, there is a much greater time difference in the delay periods $t_{SWLH}$ and $t_{SWHL}$ for waveform 12 than for waveform 10, which in turn illustrates that the $T_{CO}$ LH/HL skew increases with increasing voltage swings of the signal transitions of the pre-driver waveform.

In the past, lower frequency digital bus output buffers tolerated a fairly significant amount (wide spread) of $T_{CO}$ HL/LH skew caused by PVT. But this wide spread $T_{CO}$ HL/LH skew directly limits the bus speed when bus frequency approaches to Ghz range. As digital bus frequency keeps increasing, the design specifications for output buffers require smaller amounts of $T_{CO}$ LH/HL skew. For the reasons stated above, and for other reasons stated below which will become apparent to those skilled in the art upon reading and understanding the present specification, there is a need in the art to reduce $T_{CO}$ LH/HL skew.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 2:
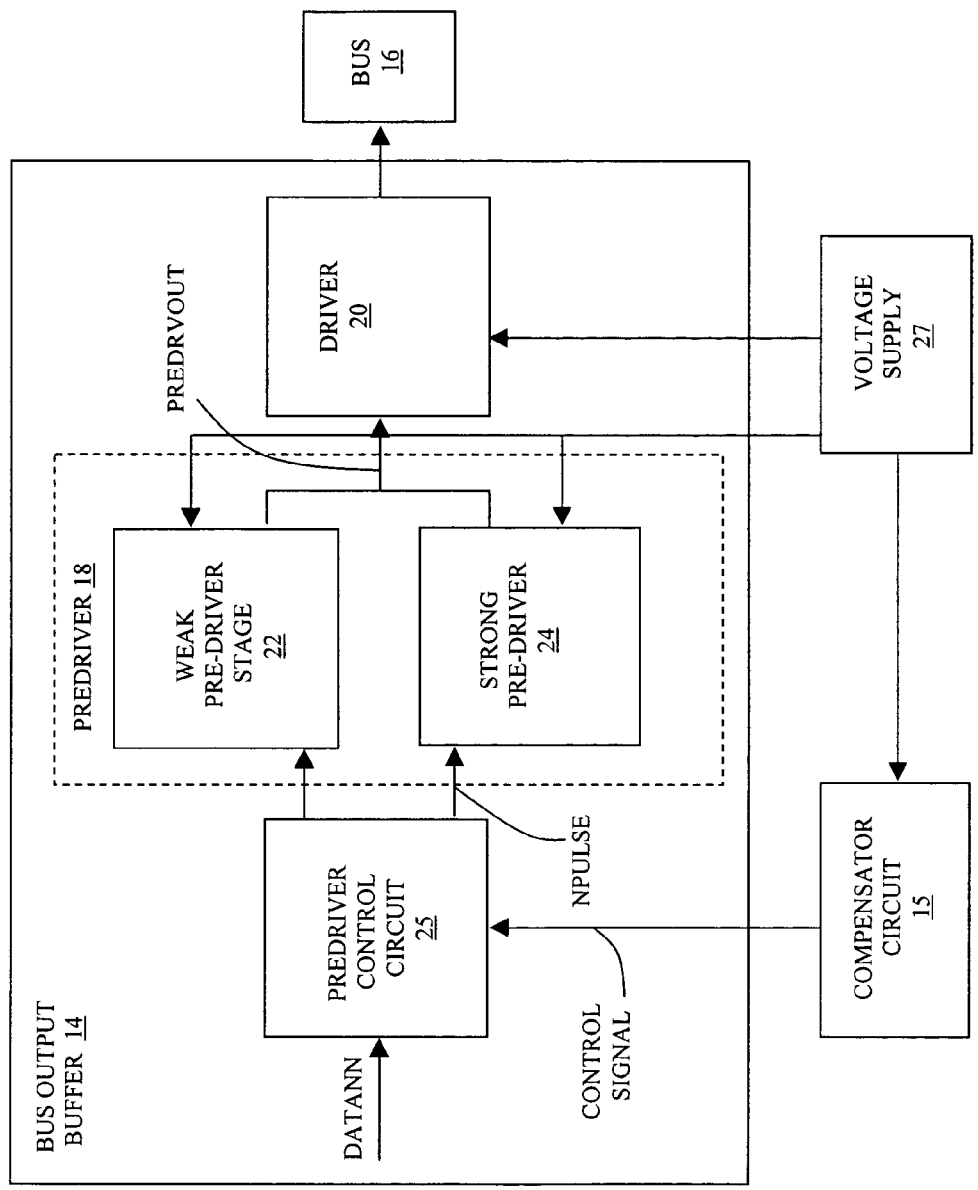
FIG. 2 is a block diagram illustrating a bus output buffer and a compensator circuit for that bus output buffer according to one embodiment of the present invention.
Figure 7:
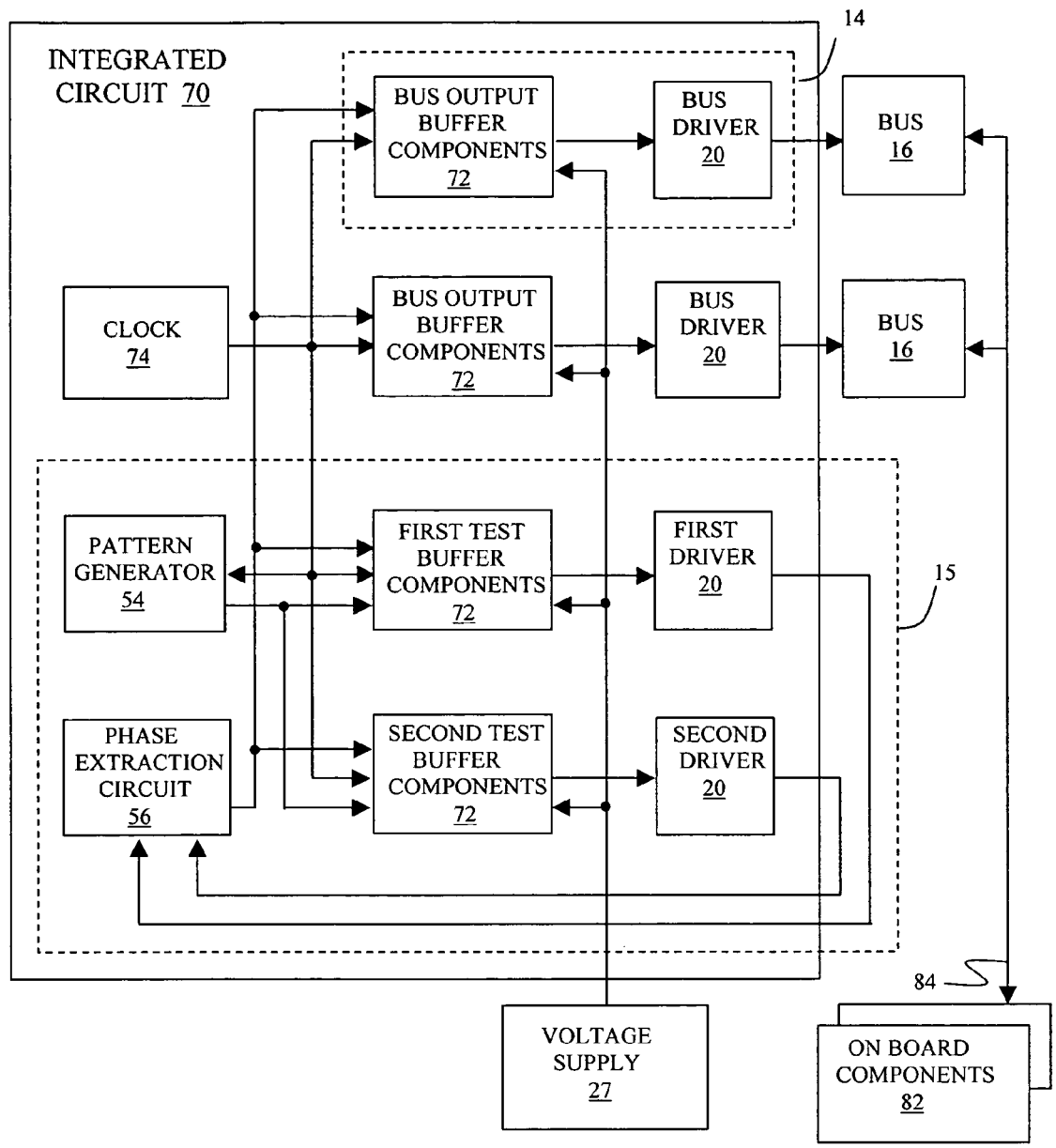
FIG. 7 illustrates an example system incorporating bus output buffers with a compensator circuit.

FIG. 2 provides a simplified overview of one embodiment of the present invention showing a bus output buffer 14 with a compensator circuit 15 for reducing $T_{CO}$ LH/HL skew. An IC (such as shown in FIG. 7) is provided with a plurality of bus output buffers 14, disposed across its boundary. The bus output buffer 14 places an IC's internal digital signal onto an external digital bus 16. The bus output buffer 14 includes a pre-driver 18 and driver 20 with the pre-driver 18 including a weak (first) pre-driver stage 22 and a strong (second) pre-driver stage 24. A pre-driver controller circuit 25, in response to an input data signal DATANN and a control signal (bias voltages) from the compensator circuit 15, controls and drives the operation of the driver 20.

Figure 3:
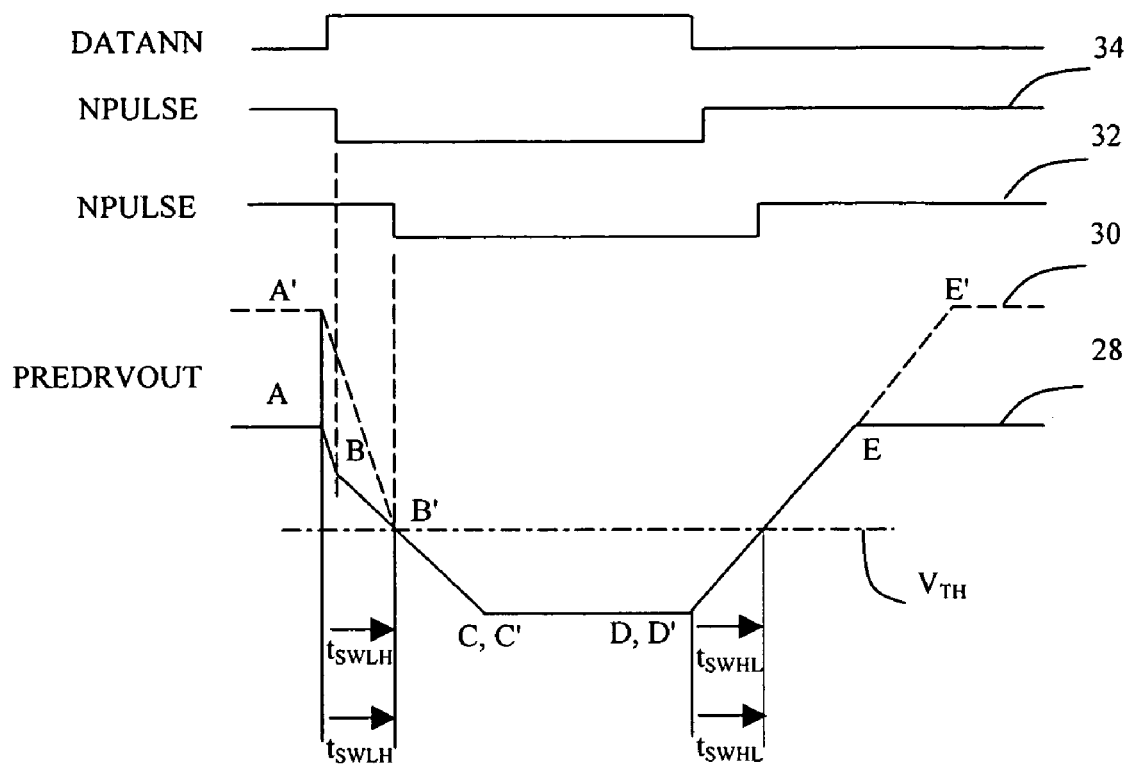
FIG. 3 illustrates a timing diagram for two example compensated pre-driver waveforms which are reshaped by a strong pre-driver stage shown in FIG. 2.

The outputs of the weak and strong stages 22 and 24 are commonly coupled to the input of the driver 20. The combined output signals of the stages 22 and 24 drive the low-to-high (LH) and high-to-low (HL) signal transitions of the driver 20. More specifically, as shown in FIG. 3, the input of the driver 20 has a threshold voltage $V_{TN}$ (switch level) which triggers signal transitions of its output signal. The waveform PREDRVOUT, generated by the weak and strong stages 22 and 24, triggers a low-to-high (LH) transition of the driver's output signal after a LH switching delay period $t_{SWLH}$ and triggers a high-to-low (HL) transition of the driver's output signal after a HL switching delay period $t_{SWHL}$. The signal switching delay time periods $t_{SWLH}$ and $t_{SWHL}$ are defined in the Background Section. IT should be noted that in FIGS. 1 and 3, the LH and HL designations are taken with respect to the output of the driver 20 and not with respect to the transitions of the waveform PREDRVOUT.

Figure 1:
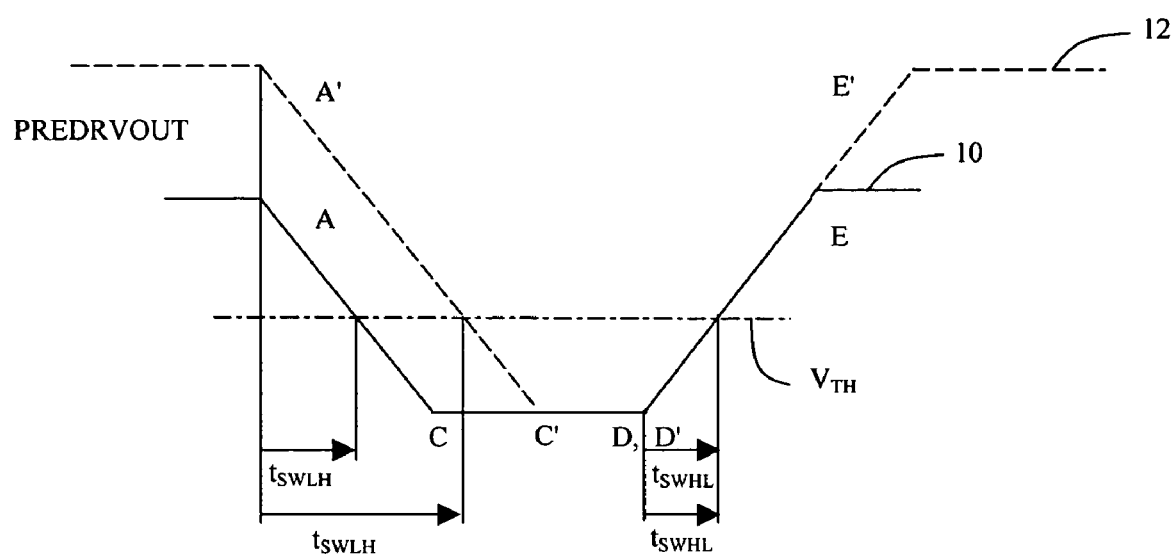
FIG. 1 illustrates two uncompensated pre-driver waveforms of a prior art output buffer.

Focusing first on the contribution of the weak stage 22, the weak stage 22 is responsive to the DATANN input signal provided to the control circuit 25 to generate at its output an initial pre-driver waveform, as illustrated in FIG. 1. This pre-driver waveform defines the slew rate of the driver 20. When the strong stage 24 is turned on by the control circuit 25, its contribution modifies the initial pre-driver waveform provided by the weak stage 22 to generate a modified or reshaped pre-driver waveform (PREDRVOUT) shown in FIG. 3. In this embodiment of the invention, the strong pre-driver stage 24 contributes to the pre-driver waveform for an adjustment period having a duration set by the control circuit 25 in response to the control signal from the compensator circuit 15. More specifically, the compensator circuit 15, by use of a feedback mechanism to be described hereinafter with respect to FIG. 4, provides a control signal (bias voltages) to adjust the adjustment period during which the strong stage 24 reshapes the initial pre-driver waveform, such adjustment period comprising at least a part or a portion of one of the switching delay periods $T_{SWLH}$ or $T_{SWLH}$.

With the illustrative phase detection scheme of this embodiment, the driver's uncompensated $T_{CO}$ skew of its LH transition lags the $T_{CO}$ skew of its HL transition. Hence, the strong stage 24 is turned on during at least a portion of the delay period $T_{SWLH}$. When turned on, the strong pre-driver stage 24 increases the rate of voltage change of the initial pre-driver waveform to shorten the delay period $T_{SWLH}$. Consequently, the compensator circuit 15, by adaptively controlling the adjustment period during which the strong pre-driver stage 24 increases the rate of voltage change of the pre-driver waveform, reduces the $T_{CO}$ LH/HL skew (described in Background section), as will be described in more detail with respect to FIG. 3.

Thus, decreasing the rate of voltage change during the delay period $T_{SWHL}$ to lengthen the same also reduces $T_{CO}$ LH/HL skew, i.e., matches the $T_{CO}$ LH to the $T_{CO}$ HL skew. Likewise, when adjusting both delay time periods $T_{SWLH}$ or $T_{SWHL}$ to change the slew rate, one delay period may be adjusted more than the other to reduce or eliminate $T_{CO}$ LH/HL skew. In the phase scheme illustrated in this embodiment, the LH $T_{CO}$ lags the HL $T_{CO}$. In other phase detection schemes within the scope of the invention, the HL $T_{CO}$ may lag the LH $T_{CO}$ (the delay period $T_{SWLH}$ is shorter than the delay period $T_{SWHL}$), which would lead to a design wherein the strong pre-driver stage 24 is turned on during delay time period $T_{SWHL}$ to shorten it.

Referring to FIGS. 2 and 3, the bus output buffer 14 and the compensator circuit 15 reshapes the two initial predriver waveforms of FIG. 1 to create two modified (reshaped or compensated) waveforms (PREDRVOUT) 28 and 30. The first pre-driver waveform 28 is defined by breakpoints A, B, C, D, E and the second pre-driver waveform 30 is defined by breakpoints A', B' C', D', E'. In response to the low-to-high transition of the input data DATANN, the control circuit 25 causes the weak stage's output to transition from low-to-high and turns on the strong stage 24. Additionally, a delay pulse NPULSE is generated by the control circuit 25 under the timing control of the CONTROL SIGNAL from the compensator circuit 15. The delay pulse NPULSE controls the duration of turned-on time (adjustment period) of the strong stage 24 and thereby controls the depth of the wave-shaping. The greater the voltage swing of the pre-driver waveform, the greater the depth of the wave-shaping, as illustrated by the waveform segments AB and A'B' of the waveforms 28 and 30. The depth of segments A'B' and AB are determined by two delay pulses 32 and 34. The first NPULSE 32 is delayed longer relative to DATANN signal; hence, the waveform segment A'B' is extended deeper. The second NPULSE 34 is delayed a shorter time relative to DATANN; hence, there is a shallower AB segment. With these augmented pre-driver waveforms 28 and 30, the time delay period $t_{SWLH}$ can be adjusted to be equal to the time delay period $t_{SWHL}$. For the output signal of the driver 20 of FIG. 2, this allows for the output $T_{CO}$ LH switching to be adjusted to match the $T_{CO}$ HL switching.

The shape (slope) of the segments BC and DE of the pre-driver waveforms in FIG. 3 are set by the predriver weak stage 22. The slope of segments BC and DE controls the LH and HL slew-rate of the output of the driver 20. Hence, control of slew-rate and $T_{CO}$ are independent.

As will be described in detail with respect to FIG. 4, for the embodiment, the compensator circuit 15 uses two test output buffers (which are identical to bus output buffer 14 of FIG. 2) to receive two simulated digital input waveforms with a 180 phase difference. By use of a feedback mechanism between the two test buffer's outputs and the strong pre-driver stages of the two test buffers, the compensator circuit 15 produces the control signal for controlling not only the adjustment period during which the strong stages of the two test buffers are turned on, but also the adjustment period during which the strong stage 24 of the bus output buffer 14 is turned on.

Referring back to FIG. 2, the pre-driver 18 of the bus buffer 14 and the identical pre-drivers of the test buffers in the compensator circuit 15 are in the same PVT environment, as is more evident in FIG. 7. The voltage supply 27 provides a source voltage $V_{CCT}$ to the various logic components of the bus buffer 14 (including the weak and strong stages 22 and 24) and also to these same components in the test buffers in the compensator circuit 15. This supply voltage typically can vary ±10% around 1.2 volts as shown by the two pre-driver waveforms illustrated in each of the FIGS. 1 and 3. Hence, the control signal is at least in part a function of the $V_{CCT}$ voltage and $V_{CCT}$ voltage variations, which are common to both the pre-drivers of the bus buffer 14 and the pre-drivers of the compensator circuit 15. Hence, variations of the $V_{CCT}$ voltage impacts $T_{CO}$ LH/HL skew of the bus buffer 14 and the test buffers of the compensator circuit 15 in the same way and to the same degree. The compensator circuit 15, by generating the control signal to reduce or eliminate $T_{CO}$ LH/HL skew in the test buffers of the compensator circuit 15, also distributes this same control signal to the bus buffer 14 to reduce or eliminate $T_{CO}$ LH/HL skew in the bus buffer 14.

Referring to FIG. 4, one embodiment of a compensator circuit 15 is shown for use in controlling $T_{CO}$ LH/HL skew for one or more bus output buffers 14. The compensator circuit 15 addresses the $T_{CO}$ HL/LH matching issue by use of a closed-loop feedback mechanism. The compensator circuit 15 includes a first test output buffer 36 and a second test output buffer 38 in a forward path. The components of the two test buffers 36 and 38 are identical to the components of the bus buffer 14 shown in FIG. 2. Hence, the same reference numbers are used for the components of all the buffers 14, 36 and 38. Hereinafter, as being descriptive of all the bus buffers 14 and the two test buffers 36 and 38 of the compensator circuit 15, a detailed description of output buffer 38 is provided below with respect to FIGS. 4, 5 and 6. In the claims, where it is desirable to distinguish between the identical components of the bus buffers 14 and the test buffers 36 and 38 in the compensator circuit 15, the terms "bus" and "test" are used to qualify the components' identifications, e.g., the "bus driver" and the "test driver".

Figure 4A:
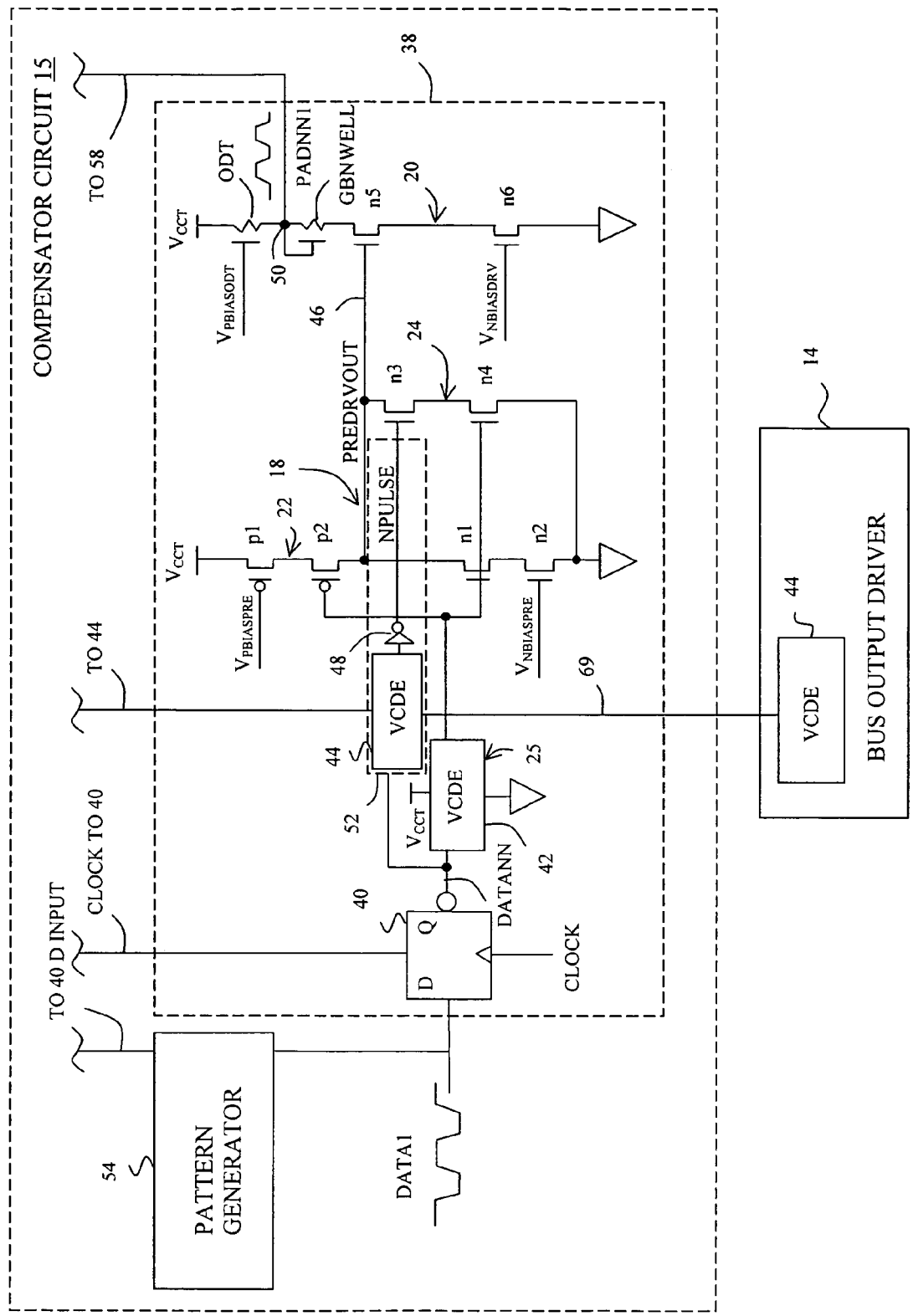
FIGS. 4 (4A and 4B) is a schematic diagram illustrating one embodiment of the compensator circuit of FIG. 2.
Figure 4B:
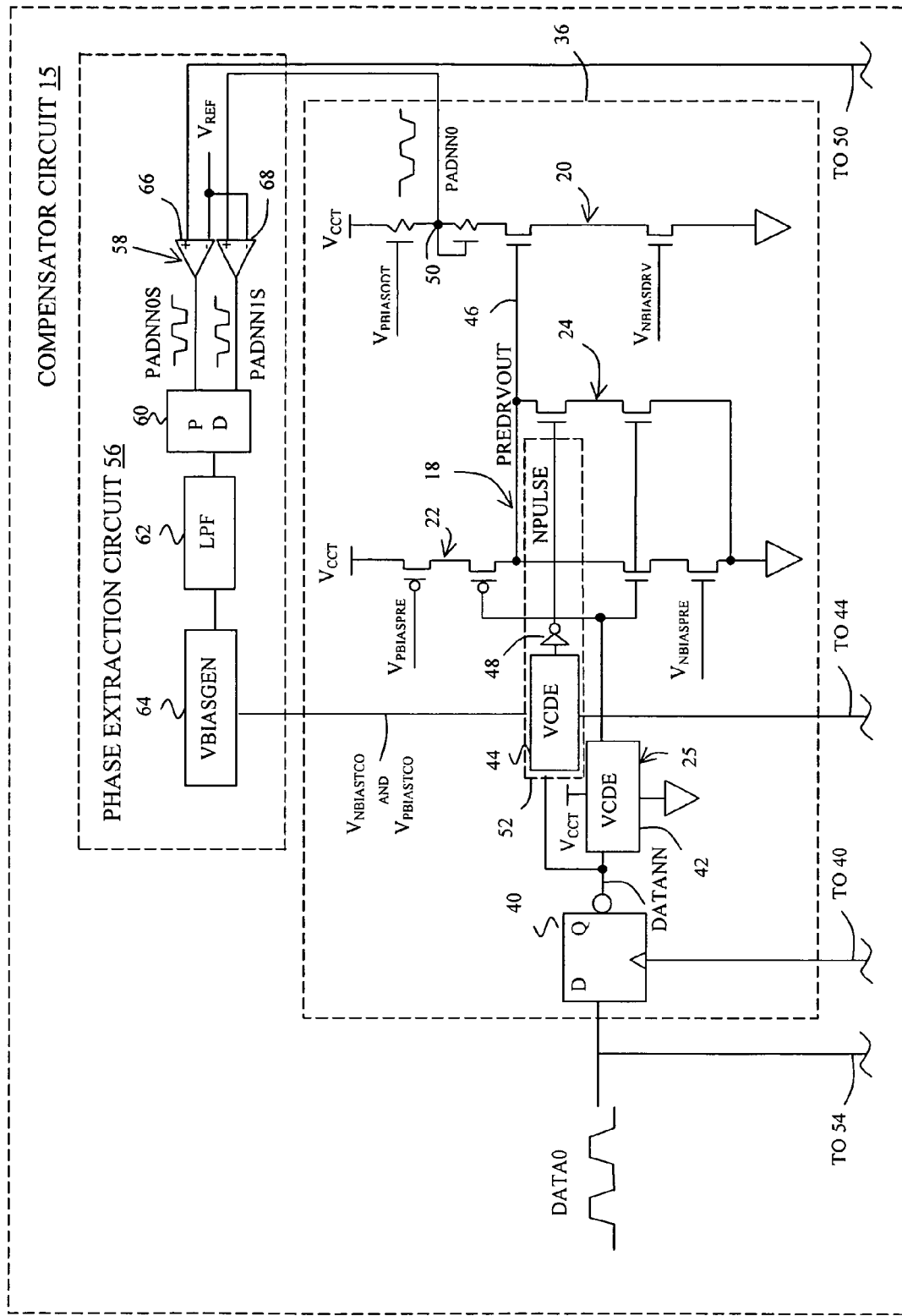

Referring to FIG. 4 (divided over FIGS. 4A and 4B), for the embodiment, the output buffer 38 (and therefore also buffers 14 and 36) includes a D type flip-flop 40, a matching and uncompensated first Voltage Control Delay Element (VCDE) 42, a compensated second VCDE 44, the pre-driver 18 having the weak stage 22 and the strong stage 24, and the driver 20 (N-type). The flip-flop 40, in response to a clock signal (CLOCK), receives a data signal (logical 0 or 1) on its D input terminal and transfers it to the inverted Q output terminal. The clock generator providing the clock signal is not shown in FIG. 4, but is illustrated in FIG. 7. The signal DATANN is provided both to the uncompensated first VCDE 42 (matching delay element) and the compensated second VCDE 44. The second VCDE 44 is described as being "compensated" because it is adjusted by bias voltage signals $V_{PBIASTCO}$ and $V_{NBIASTCO}$ (control signal) in a manner to be described hereinafter, whereas the first VCDE 42 is uncompensated (no bias voltages signals $V_{PBIASTCO}$ and $V_{NBIASTCO}$).

The weak pre-driver stage 22 includes in series two P-channel transistors p1 and p2 and two N-channel transistors n1 and n2. More specifically, the transistor p1 has its source coupled to the external supply voltage $V_{CCT}$ and its drain connected to the source of transistor p2. The drain of transistor p2 is connected to a pre-driver output node 46. The transistor n2 has its source coupled to an external ground and its drain connected to the source of transistor n1. The drain of transistor n1 is connected to the output node 46. The gates of transistors n1 and p2 are commonly coupled to the output of the first VCDE 42. The gates of transistors p1 and n2 are coupled to biasing voltages $V_{PBIASPRE}$ and $V_{NBIASPRE}$, respectively, to compensate for PVT in a conventional manner. In a conventional manner, the transistors p2 and n1 operate as an inverter to invert the signal from the VCDE 42 and to provide an output signal on the pre-driver output node 46.

The strong pre-driver stage 24 includes N-channel transistors n3 and n4 in series, with the transistor n3 having its drain connected to output node 46 and its source connected to the source of transistor n4. The transistor n4 has its drain connected to the source of transistor n3 and its source connected to ground. The output of VCDE 42 is coupled to the gate of transistor n4. The output of VCDE 44 is coupled through an inverter 48 to the gate of transistor n3. The signal on the output node 46 is identified in FIG. 4 as pre-driver waveform PREDRVOUT.

The N-type driver 20 includes in series N-channel transistors n5 and n6, with the transistor n6 having its drain connected to the source of transistor n5 and its source connected to ground. The transistor n5 has its source connected to the drain of transistor n6 and its drain connected to a GBNWELL device, which provides electrostatic protection via a conventional one resistor and multiple diode arrangement. The gate of transistor n5 is connected to a driver output node 50 so as to receive the pre-driver waveform (PREDRVOUT) and the gate of transistor n6 receives pre-set biasing voltage $V_{NBIASDRV}$, which compensates for PVT in a conventional manner. The device GBNWELL is coupled to the N-driver output node 50. The impedance ODT (On Die Termination), which provides impedance matching in a conventional manner, is coupled between the N-driver node 50 and the supply voltage $V_{CCT}$ and is biased by a bias voltage signal $V_{PRIASODT}$, which compensates for PVT in a conventional manner.

Figure 5:
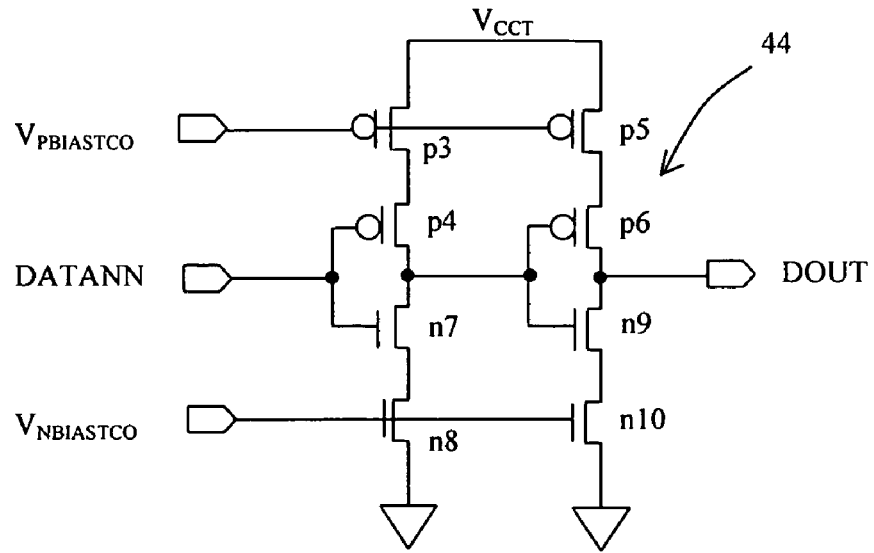
FIG. 5 is a schematic diagram illustrating one embodiment of a compensated voltage control delay element (VCDE) shown in FIG. 4.
Figure 6:
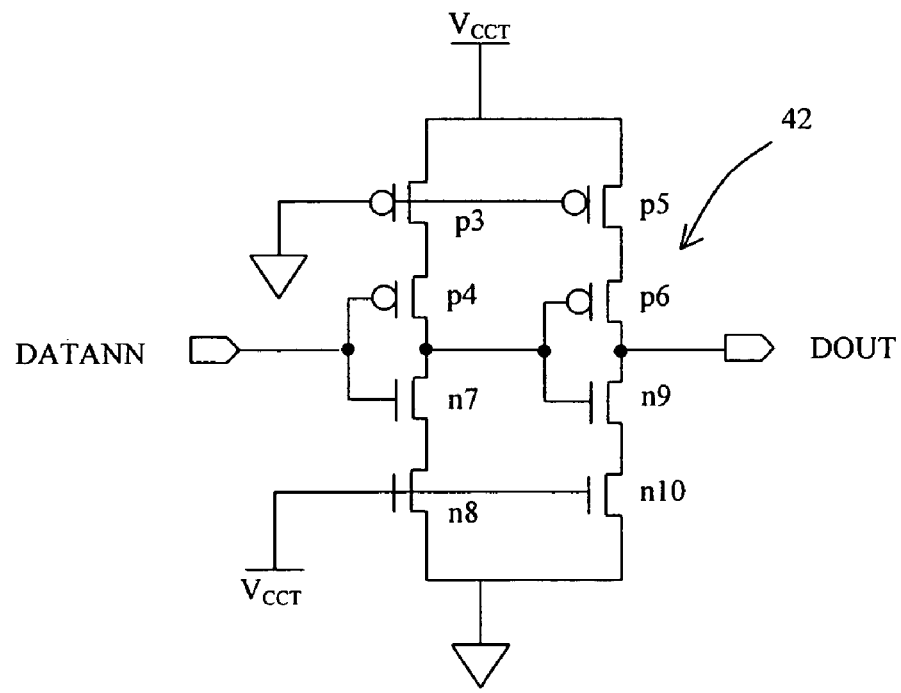
FIG. 6 is schematic diagram illustrating one embodiment of an uncompensated voltage control delay element (VCDE) shown in FIG. 4.

For each buffer 14, 36, and 38, the control circuit 25 is defined to include the first VCDE 42, the second VCDE 44 and the inverter 48. A subset of this circuitry is defined to be the transition adjustment circuit 52, which includes the second VCDE 44 and the inverter 48. The transition adjustment circuit 52 generates the delay signal NPULSE in response to the control signal. FIG. 5 shows a circuit topology of the compensated VCDE 44, which consists of two stages of inverters. The first inverter comprises a transistor leg of transistors p3, p4, n7, and n8, and the second converter comprises the transistor leg of transistors p5, p6, n9, and n10. The transistors p3 and p5 gates are provided with bias voltage $V_{PBIASTCO}$ and the transistors n8 and n10 gates are provided with bias voltage $V_{NBIASTCO}$, with such bias voltages being adjusted to produce an adjustable delay in producing delay pulse NPULSE. Referring to FIG. 6, the uncompensated VCDE 42 is identical to the VCDE 44 of FIG. 5 and has the same two transistor legs as VCDE 44, except the gates of the transistors p3 and p5 are coupled to ground and the gates of the transistors n8 and n10 are coupled to supply voltage rail $V_{CCT}$.

Referring to FIGS. 3 and 4, the first VCDE 42 drives the weak stage 22. Additionally, in response to the low-to-high transition of input data DATANN, VCDE 42 turns on the transistor n4 of the strong stage 24. The second VCDE 44 also receives the input data DATANN. But unlike the first VCDE 42, it can delay its output version of DATANN by an adjustable delay under the control of the control signal (bias voltages) of the compensator circuit 15. Inverter 48 inverts the output of VCDE 44 to create the delay pulse NPULSE, which basically is an inverted and delayed version of DATANN. At the time of the LH transition of DATANN when the VCDE 42 turns on transistor n4, NPULSE is high; therefore, the transistor n3 is already turned on. Hence, turning on transistor n4 by the first VCDE 42 turns on the strong leg 24. As previously explained, the wave-shaping is carried out by turning on the strong pre-driver stage 24, i.e., turning on the transistors n3 and n4. The delay pulse NPULSE from the second VCDE 44 controls the duration of turned-on time (the adjustment period) of the strong pre-driver stage 24 by turning off transistor n3 when the output of the inverter 48 transitions from high-to-low, as illustrated by two NPULSES 32 and 34. The point in time at which the delay pulse NPULSE undertakes its HL transition to turn off the strong stage 24 is determined by the bias voltages (control signal) provided by the compensator circuit 15.

As previously explained, the above description of FIGS. 4, 5, and 6 describes both the first and second test output buffers 36 and 38 and the plurality of bus output buffers 14, since all these buffers are identical in components, in the illustrated embodiment.

Referring back to FIG. 4, one embodiment of the compensator circuit 15 is now described. For the embodiment, the forward path to the compensator circuit 15 includes a pattern generator 54 and the already described components of the test output buffers 36 and 38, such as the flip-flop 18, first VCDE 42, the second VCDE 44, weak pre-driver stage 22, the strong pre-driver stage 24, and the driver 20. The pattern generator 54 continuously drives the two output buffers 36 and 38 with data signal waveforms having a 180 degree phase-shift. These two input waveforms are illustrated by the DATA0 and DATA1 waveforms in FIG. 4 and are shown as inputs to the flip-flops 40 of the test output buffers 36 and 38, respectively, with the two waveforms being shifted by 180 degrees. These two input waveforms simulate the data waveforms that would be received by the bus output buffers 14, in that the DATA0 and DATA1 waveforms are processed through the buffers 36 and 38 with the same $V_{CCT}$ supply voltage and clock; hence, their pre-driver waveforms of FIG. 3 generate the same $T_{CO}$ LH/HL skew as the bus output buffers 14. The output signals of the output buffers 36 and 38, provided on the N driver output nodes 50, are illustrated by waveforms PADNN0 and PADNN1. A transition adjustment circuit 52 is defined to include the second VCDE 44 and the inverter 48, and will be discussed hereinafter.

In FIG. 4 the compensator circuit 15 also includes a feedback path for correcting $T_{CO}$ skew, which includes a phase extraction circuit 56. The components of the phase extraction circuit 56 include a sample circuit 58, a phase detector 60, a low pass filter 62 and a biased voltage generator 64. The sample circuit 58 has a pair of comparators 66 and 68 which receive the waveforms PADNN0 and PADNN1, respectively, from the output buffers 36 and 38. The sample circuit 58 compares each of the two waveforms to a reference voltage $V_{ref}$, to generate full swing output waveforms PADNN0S and PADNN1S as shown in FIG. 4. These waveforms are transmitted from the sample circuit 58 to the input of the phase detector 60, which determines the phase difference between waveforms PADNN0S and PADNN1S. The output of the phase detector 60 is coupled to the input of the low pass filter 62, which in turn provides a filtered signal to the bias voltage generator 64. Based on the phase difference of the outputs of the two buffers 36 and 38, the biased voltage generator 64 generates the control signal, which includes the bias voltages, i.e., $V_{PBIASTCO}$ and $V_{NBIASTCO}$, and provides the control signal to the transition adjustment circuits 52 in the forward path of the buffers 36 and 38.

The transition adjustment circuit 52 included in the bus output buffer 14, along with the two transition adjustment circuits 52 in the two test buffers 36 and 38, are all identical. Since the transition adjustment circuit 52 is identical for all buffers 14, 36 and 38, it is only shown and described only in FIG. 4. Each of the transition control circuits 52 comprises the already described VCDE 44 with the inverter 48, which provides the delay pulse NPULSE to the strong pre-driver stage 24 in response to the control signal (bias voltages, i.e., $V_{PBIASTCO}$ and $V_{NBIASTCO}$) from the phase extraction circuit 56. With respect to the VCDEs 44 of the test buffers 36 and 36, they adjust the phase difference between the outputs of the test buffers 36 and 38.

In summary, the bias voltages $V_{PBIASTCO}$ and $V_{NBIASTCO}$ (control signal) are distributed to the transition adjustment circuits 52 of the two test buffers 36 and 38 and also are distributed to the transition adjustment circuits 52 of all bus buffers 14 via the conductor 69 in FIG. 4. Each of the transition adjustment circuits 52, in response to the control signal, produces the delay signal NPULSE for turning off its corresponding strong stage 24. The pre-driver waveform PREDRVOUT, outputted by the pre-driver on node 46, is reshaped by the strong stage 24 under the control of the compensator circuit 15 via the control signal.

The use of closed-loop feedback of FIG. 4 to control the $T_{CO}$ HL/LH skew may be implemented in different types of output buffers 14, 36 and 38, including, but not limited to, AGTL+, CMOS output buffers. Merely for the purposes of illustration, the output buffers 14, 36 and 38 in FIG. 4 were selected to be AGTL+ output buffers. AGTL+ signaling has a unique switching characteristic due to the driver 20 being only a NMOS device. This 'NMOS device only' driver 20 shown in FIG. 4 is particularly useful in illustrating one embodiment of the invention because it inherently leads to $T_{CO}$ HL/LH mismatching. The switching threshold of the NMOS driver 20 is around the threshold voltage ($V_{TN}$) of the NMOS transistors n5 and n6. With current technology, the $V_{TN}$ for the NMOS transistors n5 and n6 is about 0.3V, which is shown in FIGS. 1 and 3. However, the switching threshold the voltage $V_{TN}$ may vary. All N-channel and P-channel transistors shown herein may be MOSFET transistors.

Additionally, the weak driver stage 22 may also be compensated over Process, Voltage and Temperature (PVT) by adjustable biased voltages VPBIASPRE and VNBIASPRE. Likewise, the biased voltages VPBIASODT and VNBIASDRV control ODT driver impedance and the NMOS drivers 20.

Referring to FIG. 4, the compensator circuit 15 is an interlock compensator and may be implemented for either an analog and digital compensation. The closed-loop feedback mechanism of the compensator circuit 15 locks when the phase difference between the two driver outputs is 180 degrees out of phase. In order for the feedback mechanism of circuit 15 to be locked, generally two conditions need to be met. First, the driver $T_{CO}$ of the LH transition has to lag behind that of the HL transition with the phase detection scheme illustrated in FIG. 4 or vice versa with a different phase detection scheme based upon driver $T_{CO}$ of the HL transition lagging behind that of the LH transition. In the latter case, the slope of waveform segments DE and D'E' would be modified by increasing the rate of voltage change during at least part of the time delay period $t_{SWHL}$. Second, the initial, uncompensated $T_{CO}$ skew has to be less than the maximum locking skew. The first VCDE 42 serves the purpose of these initial tunings. By reducing or increasing the time delay of the rising or falling of the VCDE 42, the driver $T_{CO}$ can be tuned such that the first condition is substantially assured for all corners of PVT. Because the technique of reshaping pre-driver waveform is used to control $T_{CO}$ skews between LH and HL transitions of the driver's output, there may be a limit of the skew range that can be controlled without deteriorating the edge rate. Hence, there is a need to characterize this potential maximum skew limit over all PVT corners. Then by adjusting the delay skew of the first VCDE 42, the initial $T_{CO}$ skew of the driver will fall within the locking range. When power supply voltage increases, the uncompensated driver $T_{CO}$ skew will increase accordingly. Multiple stages of VCDE are desirable for the first VCDE 42 to cover the two above-described initial conditions.

Referring to FIG. 7, there is illustrated one of many possible systems in which the output buffers 14 and compensator circuit 15 may be implemented. In this illustrative implementation, the bus output buffers 14 are of a sufficient robust design to have the necessary power to drive signals from an integrated circuit (IC) 70 of a chipset to another on-board component 82 through a long trace 84. Examples of these on-board components may include, but are not limited to, microprocessors, memory controllers, bus controllers, video controllers, graphics controllers, and other I/O controllers of the like. In various embodiments, the length of the traces may be as long as 10" or greater. All the components of the output buffers 14, 36, and 38 are on the chip 70, including the drivers 20. Likewise, the pattern generator 54 and phase extraction circuit 56, along with a clock generator 74, are on the chip. The interconnections of the components are described in FIGS. 2 and 4, but in general the same source voltage from voltage source 27 and clock signal from clock generator 74 are fed to all the output buffers 14 and the compensator circuit 15.

Although this implementation of FIG. 7 uses the bus buffer 14 and compensator circuit 15 for driving an external bus, it is contemplated that the buffer 14 and the circuit 15 may be used to drive an internal bus of an IC. Although the buffer 14 and circuit 15 are shown for providing control signal (bias voltages) for pre-driver stages 24 located on a single chip 70, it is contemplated that the control signal to pre-driver stages on other chips.

Figure 8:
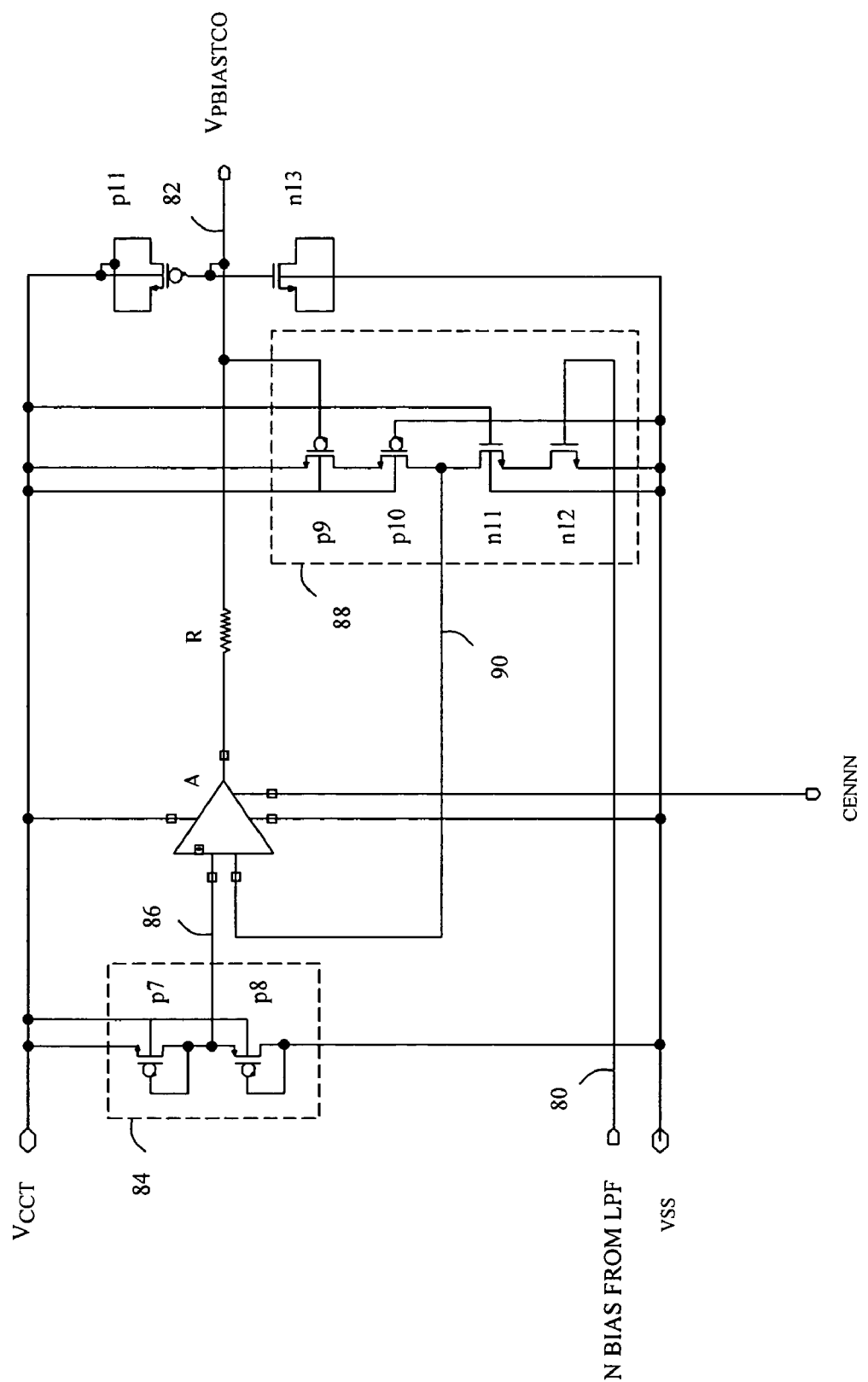
FIG. 8 is a schematic diagram illustrating a bias voltage generator shown in FIG. 4B.

A detailed schematic of the bias voltage generator 64 of FIG. 4B is shown in FIG. 8 for generating the bias voltage $V_{PBIASTCO}$. The generator 64 receives an N bias signal from the LPF (LPF 62 in FIG. 4B) on a line 80 and provides as an output the P bias voltage $V_{PBIASTCO}$ on a node 82. The bias generator 64 includes a reference voltage generator 84. The reference voltage generator 84 includes p-channel transistors P7 and P8, which are coupled to the supply voltage $V_{CCT}$ and a voltage VSS (i.e., ground) respectively and a common node 86. The common node 86 is coupled to one input of a differential amplifier A, which has an output coupled through a resistor R to the node 82 so as to provide the bias voltage $V_{PBIASTCO}$. A sample circuit 88 of a VCDE includes a transistor leg of p-channel transistors p9 and p10 and n-channel transistors n11 and n12. The sample circuit 88 is coupled between the supply voltage $V_{CCT}$ and the voltage VSS. The drains of transistors p10 and n11 are connected to a node 90, which in turn is connected to the other input of the amplifier A. The gate of transistor p9 is connected to node 82, the gate of transistor p10 is connected to the voltage VSS, the gate of transistor n11 is coupled to the supply voltage $V_{CCT}$ and the gate of transistor n12 is coupled to the line 80. A p-channel transistor 11 and an n-channel transistor 13 have their gates coupled to the node 82 and their drains and sources commonly coupled to the supply voltage $V_{CCT}$ and the voltage VSS respectively. A signal CENNN enables the differential amplifier A. To enable the amplifier A, the CENNN signal should be tied to low, or the same voltage as ground. The bias voltage generator 64 uses a similar circuit design for generating the bias voltage $V_{NPIASTCO}$ of FIG. 4B.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims.

What is claimed is:

1. An apparatus, comprising:
   a driver to drive an output signal having a plurality of low-to-high (LH) and high-to-low (HL) signal transitions, with each of the signal transitions having a clock-to-output delay;
   a pre-driver coupled to the driver, the pre-driver having a first and a second stage to cooperatively generate a reshaped waveform to trigger the LH and HL signal transitions of the output signal, with the first stage generating an initial waveform and the second stage modifying the initial waveform to generate the reshaped waveform based at least in part on a difference in the clock-to-output delays of the LH and HL signal transitions; and
   a compensator circuit coupled to the second stage to at least contribute to provision of a feedback in a form of a control signal, the control signal being capable of controlling an adjustment period during which the second stage modifies the initial waveform.

2. The apparatus according to claim 1, wherein the first stage is capable of setting a slew rate for the driver and the second stage is capable of changing the clock-to-output delay of one of the signal transitions of the output signal.

3. The apparatus according to claim 1, wherein the compensator circuit is capable of adaptively controlling the duration of the adjustment period to reduce the difference in the clock-to-output delays of the LH and HL signal transitions of the output signal.

4. The apparatus according to claim 1, further comprising a pre-driver control circuit coupled to the second stage and the compensator circuit to turn on the second stage in response to an input signal and to turn off the second stage in response to the control signal.

5. The apparatus according to claim 1, further comprising a voltage supply, coupled to the pre-driver and the compensator circuit, to provide a source voltage, having a voltage level, to the pre-driver and the compensator circuit; and wherein both the control signal and the difference in the clock-to-output delays of LH and HL signal transitions are in part a function of the source voltage level.

6. The apparatus according to claim 1, wherein the first stage, in response to an input signal, generates the initial waveform to trigger the LH signal transitions after a LH switching delay period and to trigger the HL signal transitions after a HL switching delay period; and wherein the compensator circuit is adapted to have the feedback compensate for a time difference between the LH and HL switching delay periods.

7. The apparatus according to claim 6, wherein the second stage is responsive to the control signal to modify the initial waveform for an adjustment period occurring during at least a part of one of the switching delay periods to generate the reshaped waveform.

8. The apparatus according to claim 1, wherein the compensator circuit includes a pattern generator to generate a first and a second test signal with the second test signal being an inverted version of the first test signal; a first and a second test output buffer coupled to the pattern generator and responsive to the first and second test signals respectively to generate a first and a second test output signal respectively; a phase extraction circuit coupled to the first and second test output buffers to extract a phase difference between the first and second test output signals to generate the control signal.

9. The apparatus according to claim 8, further including a transition adjustment circuit coupled to the second stage to generate a pulse signal to control the adjustment period in response to the control signal; and wherein the phase extraction circuit and the transition adjustment circuit form a closed-loop feedback mechanism.

10. The apparatus according to claim 8, further comprising a pre-driver control circuit coupled to the second stage and the compensator circuit and having a first voltage control delay element responsive to an input signal to generate a signal to turn on the second stage and a second voltage control delay element responsive to the input signal and the control signal to generate a pulse signal to turn off the second stage.

11. The apparatus according to claim 10, wherein the control signal comprises a pair of bias voltages to delay the output of the pulse signal from the second voltage control delay element.

12. The apparatus according to claim 9, wherein the first and second test output buffers each include a test driver coupled to the phase extraction circuit to generate one of the test output signals; a test pre-driver coupled to the test driver with the test pre-driver having a first and a second test stage to cooperatively generate a test reshaped waveform to trigger the LH and HL signal transitions of one of the test output signals, with the first test stage generating a test initial waveform and the second test stage modifying the test initial waveform to generate the test reshaped waveform; and the control signal being capable of controlling the adjustment period during which the second test stage modifies the test initial waveform.

13. An apparatus, comprising:
a driver to generate an output signal having a plurality of low-to-high (LH) and high-to-low (HL) signal transitions;
a pre-driver having a first and a second stage commonly coupled to the driver and responsive to an input signal to generate a pre-driver waveform to trigger the LH signal transitions after a LH switching delay period and to trigger the HL signal transitions after a HL switching delay period;
a compensator circuit coupled to the driver to measure and provide a feedback signal indicating a quantity reflective of a difference between the LH and HL switching delay periods; and
the second stage in communications with the compensator circuit to modify the pre-driver waveform during an adjustment period based upon the provide a feedback signal indicating the measured quantity, the adjustment period occurring during at least a portion of one of the switching delay periods.

14. The apparatus according to claim 13, the second stage is capable of adjusting the rate of voltage change of the pre-driver waveform during the adjustment period.

15. The apparatus according to claim 14, wherein the compensator circuit is capable of adaptively controlling the duration of the adjustment period to reduce a difference in the clock-to-output delays of the LH and HL signal transitions of the output signal.

16. The apparatus according to claim 13, further comprising a pre-driver control circuit coupled to the second stage and the compensator circuit, to turn on the second stage in response to an input signal and to turn off the second stage in response to the measured quantity.

17. The apparatus according to claim 16, wherein the pre-driver control circuit is capable of turning on the second stage during the LH or HL switching delay period which is longer; and the second stage is capable of increasing the rate of voltage change of the pre-driver waveform during the adjustment period.

18. The apparatus according to claim 17, wherein the pre-driver control circuit further including a first voltage control delay element, coupled to the second stage, to turn on the second stage in response to the input signal; and a second voltage control delay element, coupled to the second stage and the compensator circuit, to turn off the second stage in response to the measured quantity.

19. The apparatus according to claim 13, wherein the compensator circuit includes a pattern generator to generate a first and a second test signal with the second test signal being an inverted version of the first test signal; a first and a second test output buffer coupled to the pattern generator and responsive to the first and second test signals respectively to generate a first and a second test output signal respectively; a phase extraction circuit to extract a phase difference between the first and second test output signals to generate the measured quantity.

20. The apparatus according to claim 19, further comprising a transition adjustment circuit, coupled to the second stage and the compensator circuit, to generate a pulse signal to turn off the second stage in response to the measured quantity; and wherein the phase extraction circuit and the transition adjustment circuit form a closed-loop mechanism.

21. An apparatus, comprising:
a pattern generator to generate a first and a second test signal with the second test signal being an inverted version of the first test signal;
a first and a second weak pre-driver stage coupled to the pattern generator to generate a first and a second waveform respectively in response to the first and second test signals respectively, each of the waveforms having a plurality of low-to-high (HR) and a high-to-low (HL) switching delay periods;
a first and a second driver coupled to the first and second weak pre-driver stages to generate a first and a second output signal respectively in response to the first and second waveforms respectively;
a compensator circuit coupled to the first and second driver to generate a control signal on an output line in response to a phase difference between the first and second output signals; and
a first and a second strong pre-driver stage coupled to the compensator circuit and responsive to the control signal to modify the waveforms during at least part of one of the switching delay periods to generate a modified waveform.

22. The apparatus according to claim 21, further comprising at least one bus output buffer connected to the output line to receive the control signal.

23. The apparatus according to claim 22, wherein the bus output buffer includes a bus weak pre-driver stage responsive to an input signal to generate a bus waveform, the bus waveform having a bus LH and a bus HL switching delay period; a bus strong pre-driver stage coupled to the output line and responsive to the control signal to modify the bus waveform for an adjustment period during at least one of the bus switching delay periods to generate a bus modified waveform; and a bus driver coupled to the bus weak and strong pre-driver stages to generate a bus output signal in response to the bus modified waveform.

24. The apparatus according to claim 21, further comprising a first and a second transition adjustment circuit coupled to the first and second strong pre-driver stages respective to generate a first and a second pulse signal to turn off the first and second strong pre-driver stages respectively in response to the control signal; and wherein the phase extraction circuit and the first and second transition adjustment circuits form a closed loop feedback mechanism.

25. The apparatus according to claim 24, wherein the phase extraction circuit includes a sampling circuit coupled to the first and second drivers to invert one of the first and second driver waveforms to generate an inverted signal and not to invert the other the driver waveform to generate a non inverted signal; and a phase detector for comparing the phase of the inverted and non-inverted signal to generate a difference signal.

26. The apparatus according to claim 25, wherein the phase extraction circuit further includes a low pass filter coupled to the phase detector to generate a filtered difference signal in response to the difference signal; and a bias voltage generator coupled to the low pass filter to generate at least one bias voltage in response to the filtered difference signal, the transition adjustment circuits each including a voltage control delay element coupled to the bias voltage generator to generate the pulse signal in response to the at least one bias voltage.

27. A system comprising
a selected one of a graphics and a video controller;
a bus coupled to the selected one of the graphic and video controller;
a driver coupled to the bus to generate an output signal having a plurality of low-to-high (LH) and high-to-low (HL) signal transitions;
an IC component having a pre-driver coupled to the driver, and having a first and a second stage responsive to an input signal to generate a pre-driver waveform to trigger the LH signal transitions after a LH switching delay period and to trigger the HL signal transitions after a HL switching delay period;
a compensator circuit to extracting a control signal representative of the time difference between the LH and HL switching delay periods; and
a control circuit coupled to the compensator circuit and the second stage and responsive to the control signal to control an adjustment period during which the second stage is turned to reduce the time difference, the adjustment period including at least a portion of one of the switching delay periods.

28. The system according to claim 28, wherein the compensator circuit includes
a pattern generator to generate a first and a second test signal with the second test signal being an inverted version of the first test signal; and
a first and a second test output buffer coupled to the pattern generator and responsive to the first and second test signals respectively to generate a first and a second test output signal respectively; and
a phase extraction circuit to extract a phase difference between the first and second test output signals to generate the control signal.

29. The system according to claim 27, wherein said control circuit is capable of turning on the second stage in response to an input signal and for turning off the second stage in response to the control signal.

30. The system according to claim 27, further comprising a voltage supply, coupled to the pre-driver and the compensator circuit, to provide a source voltage, having a voltage level, to the pre-driver and the compensator circuit; and wherein both the control signal and the time difference in the clock-to-output delays of LH and HL signal transitions are in part a function of the source voltage level.

31. A method of operating an output buffer, comprising:
generating an output signal of a driver having a plurality of low-to-high (LH) and high-to-low (HL) signal transitions;
generating a pre-driver waveform for triggering the LH signal transitions after a LH switching delay period and for triggering the HL signal transitions after a HL switching delay period in response to an input signal;
determining a difference between a LH clock-to-output delay for the LH signal transitions and a HL clock-to-output delay for the HL signal transitions;
compensating for the difference between the LH and HL clock-to-output delays by adjusting the rate of voltage change of the pre-driver waveform during at least part of one the switching delay periods; and
wherein extracting the difference between an LH clock-to-output delay for the LH signal transitions and a HL clock-to-output delay for the HL signal transitions includes generating a first and a second test signal with the second test signal being an inverted version of the first test signal; driving a first and a second test output buffer with the first and second test signals respectively to generate a first and a second test output signal respectively; and extracting a phase difference between the first and second test output signals as representative of the difference between the LH and HL clock-to-output delays.

32. The method according to claim 31, wherein compensating for the difference between the LH and HL clock-to-output delays includes increasing the rate of voltage change of the pre-driver waveform during at least part of one the switching delay periods.

33. The method according to claim 31, wherein compensating for the difference between the LH and HL clock-to-output delays includes adjusting the length of time during which the rate of voltage is changed.

34. The method according to claim 31, wherein compensating for the difference between the LH and HL clock-to-output delays includes increasing the rate of voltage change of the pre-driver waveform during at least part of the LH or HL switching delay period which is longer.

35. An apparatus, comprising:
a driver to drive an output signal having a plurality of low-to-high (LH) and high-to-low (HL) signal transitions, with each of the signal transitions having a clock-to-output delay;
a pre-driver coupled to the driver, the pre-driver having a first and a second stage to cooperatively generate a reshaped waveform to trigger the LH and HL signal transitions of the output signal, with the first stage generating an initial waveform and the second stage modifying the initial waveform to generate the reshaped waveform based at least in part on a difference in the clock-to-output delays of the LH and HL signal transitions;
the first stage, in response to an input signal, is adapted to generate the initial waveform to trigger the LH signal transitions after a LH switching delay period and to trigger the HL signal transitions after a HL switching delay period; and
a compensator circuit to generate a control signal having a feedback, wherein the feedback compensates for a time difference between the LH and HL switching delay periods.

36. The apparatus according to claim 35, wherein the second stage is responsive to the control signal to modify the initial waveform for an adjustment period occurring during at least a part of one of the switching delay periods to generate the reshaped waveform.

* * * * *

UNITED STATES PATENT AND TRADEMARK OFFICE
CERTIFICATE OF CORRECTION

| | |
|---|---|
| PATENT NO. | : 7,005,903 B2 |
| APPLICATION NO. | : 10/726297 |
| DATED | : February 28, 2006 |
| INVENTOR(S) | : Hong H. Chan et al. |

It is certified that error appears in the above-identified patent and that said Letters Patent is hereby corrected as shown below:

Column 13

Line 31, "The system according to claim 28, ..." should read --The system according to claim 27, ...--.

Signed and Sealed this

Twenty-second Day of December, 2009

David J. Kappos
*Director of the United States Patent and Trademark Office*